United States Patent
Kamitani et al.

(10) Patent No.: US 10,862,440 B2
(45) Date of Patent: Dec. 8, 2020

(54) HIGH-FREQUENCY AMPLIFIER

(71) Applicant: PANASONIC INTELLECTUAL PROPERTY MANAGEMENT CO., LTD., Osaka (JP)

(72) Inventors: Masatoshi Kamitani, Osaka (JP); Shingo Matsuda, Kyoto (JP); Kouki Yamamoto, Shiga (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 0 days.

(21) Appl. No.: 16/535,634

(22) Filed: Aug. 8, 2019

(65) Prior Publication Data

US 2019/0363683 A1 Nov. 28, 2019

Related U.S. Application Data

(63) Continuation of application No. PCT/JP2018/004508, filed on Feb. 9, 2018.

(Continued)

(51) Int. Cl.
| | |
|---|---|
| *H03F 3/68* | (2006.01) |
| *H03F 3/19* | (2006.01) |
| *H03F 1/02* | (2006.01) |
| *H03F 1/56* | (2006.01) |
| *H04B 1/04* | (2006.01) |

(Continued)

(52) U.S. Cl.
CPC .......... *H03F 3/19* (2013.01); *H03F 1/0288* (2013.01); *H03F 1/565* (2013.01); *H03F 3/211* (2013.01);

(Continued)

(58) Field of Classification Search
CPC .......... H03F 3/19; H03F 1/0288; H03F 1/565; H03F 2200/255; H03F 2200/451;

(Continued)

(56) References Cited

U.S. PATENT DOCUMENTS 7,193,472 B2 * 3/2007 Gotou ................. H03F 1/0288
  330/124 R
9,450,543 B2 * 9/2016 Yang .................... H03F 1/48
(Continued)

FOREIGN PATENT DOCUMENTS

JP    2867987 B2    3/1999
JP    2011-182312 A    9/2011
(Continued)

OTHER PUBLICATIONS

International Search Report dated May 15, 2018 in International Application No. PCT/JP2018/004508; with English translation.
(Continued)

*Primary Examiner* — Khanh V Nguyen
(74) *Attorney, Agent, or Firm* — McDermott Will & Emery LLP

(57) ABSTRACT

A high-frequency amplifier includes: a carrier amplifier amplifying a first signal; a peak amplifier amplifying a second signal; a first transmission line connected between output terminals of the carrier amplifier and the peak amplifier, and having an electrical length equal to one-quarter wavelength of a center frequency in the predetermined frequency band; a second transmission line connected between one end of the first transmission line and the output terminal of the high-frequency amplifier, and having an electrical length equal to one-quarter wavelength of the center frequency; and an impedance compensation circuit with one end connected to a node between the first transmission line and the second transmission line. At the center frequency, an imaginary part of an impedance during viewing of the impedance compensation circuit from the node is opposite in polarity from an imaginary part of an impedance during viewing of the second transmission line from the node.

10 Claims, 16 Drawing Sheets

Related U.S. Application Data

(60) Provisional application No. 62/460,244, filed on Feb. 17, 2017.

(51) Int. Cl.
 *H03F 3/21* (2006.01)
 *H03F 3/60* (2006.01)

(52) U.S. Cl.
 CPC ........ *H03F 3/602* (2013.01); *H03F 2200/255* (2013.01); *H03F 2200/451* (2013.01); *H04B 1/04* (2013.01)

(58) Field of Classification Search
 CPC . H03F 3/245; H03F 1/07; H03F 3/211; H03F 3/602; H03F 3/604; H04B 1/04; H04B 2001/0408; H04B 1/0458
 USPC .............................................. 330/124 R, 295
 See application file for complete search history.

(56) References Cited

U.S. PATENT DOCUMENTS

| | | | |
|---|---|---|---|
| 9,876,474 B2 * | 1/2018 | Zhang | ..................... H01L 23/66 |
| 10,033,335 B1 * | 7/2018 | Chan | ....................... H03F 1/565 |
| 2012/0235749 A1 | 9/2012 | Aoki | |
| 2013/0063208 A1 | 3/2013 | Acimovic | |
| 2013/0063222 A1 | 3/2013 | Acimovic | |
| 2014/0347134 A1 | 11/2014 | Yang et al. | |
| 2015/0008983 A1 | 1/2015 | Maniwa et al. | |
| 2016/0336903 A1 | 11/2016 | Ahmed et al. | |
| 2017/0163220 A1 | 6/2017 | Yamamoto et al. | |

FOREIGN PATENT DOCUMENTS

| | | |
|---|---|---|
| JP | 2012-199706 A | 10/2012 |
| JP | 2014-197755 A | 10/2014 |
| JP | 2015-012578 A | 1/2015 |
| JP | 2015-506615 A | 3/2015 |
| WO | 2013/098639 A1 | 7/2013 |
| WO | 2016/098223 A1 | 6/2016 |

OTHER PUBLICATIONS

Written Opinion of the International Searching Authority dated May 15, 2018 in International Application No. PCT/JP2018/004508; with English translation.

* cited by examiner

HIGH-FREQUENCY AMPLIFIER

CROSS REFERENCE TO RELATED APPLICATIONS

This application is a U.S. continuation application of PCT International Patent Application Number PCT/JP2018/004508 filed on Feb. 9, 2018, claiming the benefit of priority of U.S. Provisional Patent Application No. 62/460,244 filed on Feb. 17, 2017, the entire contents of which are hereby incorporated by reference.

BACKGROUND

1. Technical Field

The present disclosure relates to a high-frequency amplifier and particularly relates to a high-frequency amplifier typified by a Doherty amplifier.

2. Description of the Related Art

As an efficient high-frequency amplifier used for radio communications or the like, a Doherty amplifier including a combination of a carrier amplifier and a peak amplifier is used. The carrier amplifier performs a class AB operation or a class B operation and the peak amplifier performs a class C operation. In the Doherty amplifier, only the carrier amplifier operates in an active region having low output power, whereas both of the carrier amplifier and the peak amplifier operate and the output signals of the carrier amplifier and the peak amplifier are combined in an active region having high output power.

In order to combine the output signals, in the Doherty amplifier, a first transmission line having an electrical length equal to one-quarter wavelength of a center frequency in a communication frequency band is connected between the output terminal of the carrier amplifier and the output terminal of the peak amplifier. Furthermore, a second transmission line having an electrical length equal to one-quarter wavelength of the center frequency in the communication frequency band is connected between the node between the first transmission line and the peak amplifier and the output terminal of the Doherty amplifier.

When the load side is viewed from the output terminal of the carrier amplifier, an impedance (hereinafter, an impedance will be referred to as "load impedance" when the load side is viewed from a certain point) only has a real part at the center frequency in the communication frequency band. However, because of the phase characteristics of the first transmission line and the second transmission line at frequencies other than the center frequency in the communication frequency band, the imaginary part of the load impedance of the carrier amplifier is positive at a frequency lower than the center frequency and is negative at a frequency higher than the center frequency. Such an extension of the imaginary part of the load impedance may deteriorate the frequency characteristics of the Doherty amplifier, preventing the extension of the band of the Doherty amplifier.

Thus, various techniques for widening the bands of Doherty amplifiers have been proposed in the related art (for example, Japanese Unexamined Patent Application Publication No. 2014-197755, WO 2016/098223).

In the technique of Japanese Unexamined Patent Application Publication No. 2014-197755 (Hereinafter, will be referred to as "PTL 1"), a third transmission line having an electrical length equal to one-half wavelength of a center frequency in a communication frequency band is connected between the node between a first transmission line and a second transmission line and the output terminal of a peak amplifier. Thus, in an active region where the peak amplifier does not operate and a Doherty amplifier has low output power, the frequency characteristics of the third transmission line compensate for the frequency characteristics of the load impedance of a carrier amplifier. This can extend the band of the Doherty amplifier.

In the technique of WO 2016/098223 (Hereinafter, will be referred to as "PTL 2"), a fourth transmission line and a fifth transmission line connected in series are connected between the node between a first transmission line and a second transmission line and the output terminal of a peak amplifier. The fourth and fifth transmission lines constitute a third transmission line having an electrical length equal to one-half wavelength of a center frequency in a communication frequency band. From among the fourth transmission line and the fifth transmission line, the characteristic impedance of the fifth transmission line close to the peak amplifier is set lower than that of the fourth transmission line, thereby compensating for the frequency characteristics of the load impedance of a peak amplifier. This can extend the band of the Doherty amplifier.

SUMMARY

In the techniques of PTL 1 and PTL 2, however, in an active region where both of the carrier amplifier and the peak amplifier operate and the Doherty amplifier has high output power, the output signal of the carrier amplifier does not pass through the third transmission line, thereby precluding the compensation for the frequency characteristics of the load impedance of the carrier amplifier. Thus, the Doherty amplifier is prevented from having a wide band in such an active region where output power is high. In other words, unfortunately, the Doherty amplifier does not have a sufficiently wide band in the techniques of PTL 1 and PTL 2.

Thus, an object of the present disclosure is to provide a high-frequency amplifier that can have a wider band than in the related art.

In order to achieve the above-described object, in accordance with an aspect of the present disclosure, there is provided a high-frequency amplifier that amplifies a first signal and a second signal of a predetermined frequency band and outputs a signal from an output terminal, the high-frequency amplifier comprising: a carrier amplifier that amplifies the first signal; a peak amplifier that amplifies the second signal; a first transmission line connected between an output terminal of the carrier amplifier and an output terminal of the peak amplifier, the first transmission line having an electrical length equal to one-quarter wavelength of a center frequency in the predetermined frequency band; a second transmission line connected between one end of the first transmission line and the output terminal of the high-frequency amplifier, the second transmission line having an electrical length equal to one-quarter wavelength of the center frequency; and an impedance compensation circuit that has one end connected to a node between the first transmission line and the second transmission line, wherein at the center frequency, an imaginary part of an impedance during viewing of the impedance compensation circuit from the node is opposite in polarity from an imaginary part of an impedance during viewing of the second transmission line from the node.

The present disclosure provides a high-frequency amplifier that can have a wider band than in the related art.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT

Figure 1:
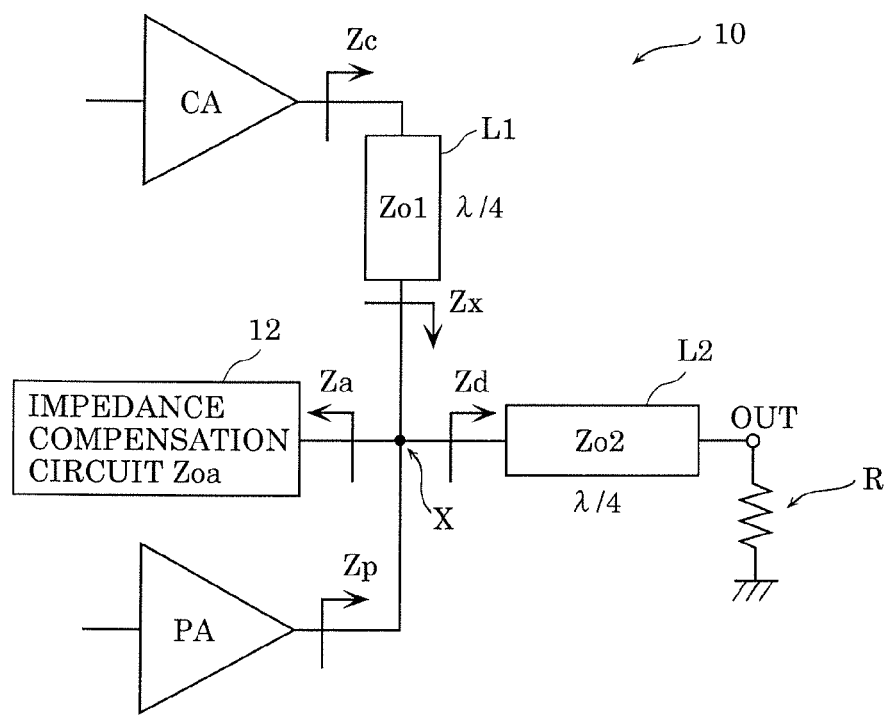
FIG. 1 is an equivalent circuit diagram of a high-frequency amplifier according to an embodiment.

Hereinafter, certain exemplary embodiments are described in greater detail with reference to the accompanying Drawings. It should be noted that all the embodiments described below are generic and specific examples of the present disclosure. Frequency, impedance, characteristic impedance, numerical values such as the number of circuit parts, material of the circuit parts, and the like described in the following embodiments are merely examples, and are not intended to limit the present disclosure. The present disclosure is characterized by the appended claims. Therefore, among the constituent elements in the following embodiments, constituent elements that are not described in independent claims that show the most generic concept of the present disclosure are described as elements constituting more desirable configurations. It should also be noted that each figure in the Drawings is a schematic diagram and is not necessarily an exact diagram. In each figure, substantially identical constituent elements are assigned with a same reference sign, and explanation of such substantially identical constituent elements is sometimes not repeated or simplified.

Embodiment

FIG. 1 is an equivalent circuit diagram of high-frequency amplifier 10 according to an embodiment. FIG. 1 also illustrates load resistor R (e.g., 50Ω) connected to output terminal OUT of high-frequency amplifier 10. Bent arrows and Zi (i may be c, x, a, d, or p) near the arrows in FIG. 1 indicate impedances viewed in the directions of the arrows from the respective points of the arrows. Moreover, Zoi (i may be 1, 2, or a) in components indicates the characteristic impedances of the components.

High-frequency amplifier 10 is a Doherty amplifier that amplifies a first signal and a second signal of a predetermined frequency band and outputs a signal from output terminal OUT. High-frequency amplifier 10 includes carrier amplifier CA, peak amplifier PA, first transmission line L1, second transmission line L2, and impedance compensation circuit 12. In FIG. 1, a splitter that splits a signal inputted to high-frequency amplifier 10 into the first signal and the second signal is omitted and a transmission line to be inserted between the splitter and the input terminal of peak amplifier PA, and the transmission line having an electrical length equal to one-quarter wavelength of a center frequency in a predetermined frequency band inserted between the splitter and an input terminal of peak amplifier PA, are omitted. The predetermined frequency band is a communication frequency band, for example, a frequency band used for radio communications at 3 THz or below.

Carrier amplifier CA is an amplifier that amplifies the first signal and performs a class AB operation or a class B operation. Carrier amplifier CA operates in all the active regions of the output power of high-frequency amplifier 10.

Peak amplifier PA is an amplifier that amplifies the second signal and performs a class C operation. Peak amplifier PA operates in an active region where high-frequency amplifier 10 has high output power. Specifically, peak amplifier PA starts operating before carrier amplifier CA enters a saturating operation. Peak amplifier PA operates in an active region where high-frequency amplifier 10 has higher output power than in this state. Peak amplifier PA is designed such that an impedance near peak amplifier PA (in other words, an impedance when peak amplifier PA is viewed from node X) is open in an active region where peak amplifier PA does not operate and high-frequency amplifier 10 has low output power.

Furthermore, carrier amplifier CA and peak amplifier PA each include not only an amplifier but also an output matching circuit for matching the output impedance of the amplifier to a predetermined value (e.g., 50Ω). In other words, carrier amplifier CA and peak amplifier PA are designed so as to obtain maximum output when the output impedance reaches the predetermined value (e.g., 50 W. The amplifiers constituting carrier amplifier CA and peak amplifier PA specifically include devices for high-frequency amplification, for example, an FET or a BJT made of materials such as GaN, GaAs, SiGe, and Si. Moreover, carrier amplifier CA and peak amplifier PA may each include a distributed constant circuit for a transmission line or the like and a lumped constant circuit for, for example, a capacitor and an inductor.

First transmission line L1 is a transmission line connected between the output terminal of carrier amplifier CA and the output terminal of peak amplifier PA. First transmission line L1 has an electrical length equal to one-quarter wavelength of the center frequency in the predetermined frequency band. Characteristic impedance Zo1 of first transmission line L1 is a predetermined value (e.g., 50Ω) matched to the output impedance of carrier amplifier CA.

Second transmission line L2 is a transmission line connected between one end (node X) of first transmission line L1 and output terminal OUT of high-frequency amplifier 10. Second transmission line L2 has an electrical length equal to one-quarter wavelength of the center frequency in the predetermined frequency band. Characteristic impedance Zo2 of second transmission line L2 is a value (e.g., 35.36Ω (=the square root of (25 Ω×50Ω))) for converting an impedance (e.g., 25Ω obtained by the parallel connection of the output impedances (50Ω) of carrier amplifier CA and peak amplifier PA) at node X between first transmission line L1 and second transmission line L2 into load resistance R (e.g., 50Ω).

Impedance compensation circuit 12 has one end connected to node X between first transmission line L1 and second transmission line L2. Impedance compensation circuit 12 compensates for the frequency characteristics of the load impedances of carrier amplifier CA and peak amplifier PA. As a first characteristic, impedance compensation circuit 12 has an impedance at the center frequency of the predetermined frequency band such that the imaginary part of impedance Za during viewing of impedance compensation circuit 12 from node X is opposite in polarity from the imaginary part of impedance Zd during viewing of second transmission line L2 from node X. As a second characteristic, characteristic impedance Zoa of impedance compensation circuit 12 is set such that a reflection coefficient during viewing of impedance compensation circuit 12 from node X is larger than a reflection coefficient during viewing of second transmission line L2 from node X. Impedance compensation circuit 12 may be a distributed constant circuit for a transmission line or the like, a lumped constant circuit for, for example, a capacitor and an inductor, or a circuit including the distributed constant circuit and the lumped constant circuit. Specific circuit configurations will be discussed later as Examples 1 to 3.

The transmission lines used in high-frequency amplifier 10 are, for example, microstrip lines. The microstrip line is made of substrate materials that are used for typical high-frequency circuits and include semiconductors, ceramics, or resins, and the microstrip line includes a transmission line that is made of materials such as Cu having excellent electric characteristics and transmits a high-frequency signal.

The operations of high-frequency amplifier 10 configured thus will be described below according to the present embodiment.

(1) Active Region where Peak Amplifier PA does not Operate and High-Frequency Amplifier 10 has Low Output Power As described above, in an active region where peak amplifier PA does not operate and high-frequency amplifier 10 has low output power, an impedance is open near peak amplifier PA. Thus, impedance Zx during viewing of node X from carrier amplifier CA (from among both terminals of first transmission line L1, the terminal not connected to carrier amplifier CA) is a parallel impedance of impedance Zd during viewing of second transmission line L2 from node X and impedance Za during viewing of impedance compensation circuit 12 from node X (hereinafter, impedance Zx may be referred to as "combined impedance Zx"). Thus, when an admittance during viewing of second transmission line L2 from node X is expressed as Yd(=1/Zd) and an admittance during viewing of impedance compensation circuit 12 from node X is expressed as Ya (=1/Za), combined impedance Zx is expressed by equation 1 below:

$$Zx=1/(Yd+Ya) \qquad \text{(equation 1)}$$

In this case, because of the first characteristic of impedance compensation circuit 12, the imaginary part of impedance Za is opposite in polarity from the imaginary part of impedance Zd at the center frequency of the predetermined frequency band. Thus, the imaginary part of admittance Yd and the imaginary part of admittance Ya are opposite in polarity. Consequently, the imaginary part of the denominator (Yd+Ya) on the right side of equation 1 has a smaller value than in the absence of impedance compensation circuit 12 (in this case, Yd). In other words, the imaginary part of combined impedance Zx expressed by equation 1 has a smaller value than in the absence of impedance compensation circuit 12, thereby extending the band of high-frequency amplifier 10. In this way, impedance compensation circuit 12 compensates for the frequency characteristics of the load impedance of carrier amplifier CA.

(2) Active Region where Carrier Amplifier CA and Peak Amplifier PA Operate and High-Frequency Amplifier 10 has High Output Power In an active region where carrier amplifier CA and peak amplifier PA operate and high-frequency amplifier 10 has high output power, load impedance Zp of peak amplifier PA is a parallel impedance of impedance Zd and impedance Za. Load impedance Zp is expressed by equation 2 below.

$$Zp=1/(Yd+Ya) \qquad \text{(equation 2)}$$

Thus, as in (1) the active region where peak amplifier PA does not operate and high-frequency amplifier 10 has low output power, the imaginary part of admittance Yd and the imaginary part of admittance Ya are opposite in polarity because of the first characteristic of impedance compensation circuit 12. The imaginary part of the denominator (Yd+Ya) on the right side of equation 2 has a smaller value than in the absence of impedance compensation circuit 12 (in this case, Yd). Therefore, the imaginary part of load impedance Zp expressed by equation 2 has a smaller value than in the absence of impedance compensation circuit 12, thereby extending the band of high-frequency amplifier 10. In this way, impedance compensation circuit 12 compensates for the frequency characteristics of load impedance Zp of peak amplifier PA.

In the active region where high-frequency amplifier 10 has high output power, an output signal from carrier amplifier CA does not pass through peak amplifier PA, so that combined impedance Zx has the same result as in equation 1. Thus, impedance compensation circuit 12 also compensates for the frequency characteristics of the load impedance of carrier amplifier CA.

As described above, high-frequency amplifier 10 according to the present embodiment is a Doherty amplifier that amplifies a first signal and a second signal of a predetermined frequency band and outputs a signal from output terminal OUT. High-frequency amplifier 10 includes: carrier amplifier CA that amplifies the first signal; peak amplifier PA that amplifies the second signal; first transmission line L1 connected between an output terminal of carrier amplifier CA and an output terminal of peak amplifier PA, first transmission line L1 having an electrical length equal to one-quarter wavelength of a center frequency in the predetermined frequency band; second transmission line L2 connected between one end of first transmission line L1 and output terminal OUT of high-frequency amplifier 10, second transmission line L2 having an electrical length equal to one-quarter wavelength of the center frequency; and impedance compensation circuit 12 that has one end connected to node X between first transmission line L1 and second transmission line L2. Here, at the center frequency, an imaginary part of an impedance during viewing of impedance compensation circuit 12 from node X is opposite in polarity from an imaginary part of an impedance during viewing of second transmission line L2 from node X.

In the active region where carrier amplifier CA and peak amplifier PA operate and high-frequency amplifier 10 has high output power as well as the active region where peak amplifier PA does not operate and high-frequency amplifier 10 has low output power, the frequency characteristics of the load impedances of carrier amplifier CA and peak amplifier PA are compensated, thereby extending the band of high-frequency amplifier 10.

The relationship between the reflection coefficient of impedance compensation circuit 12 provided in high-frequency amplifier 10 and a passage loss will be discussed below according to the present embodiment.

Figure 2:
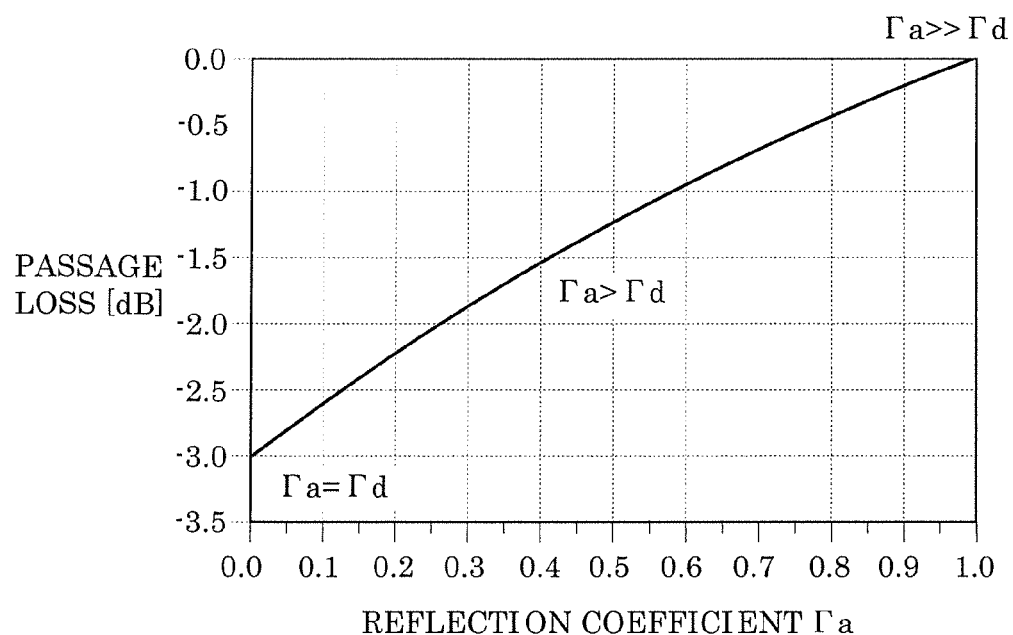
FIG. 2 shows the relationship between the reflection coefficient of an impedance compensation circuit provided in the high-frequency amplifier and a passage loss according to the embodiment.

FIG. 2 shows the relationship between the reflection coefficient of impedance compensation circuit 12 provided in high-frequency amplifier 10 and a passage loss according to the present embodiment. The horizontal axis indicates reflection coefficient Γa when impedance compensation circuit 12 is viewed from node X. In FIG. 2, reflection coefficient Γa is a value ($=(Zoa-Zo2)/(Zoa+Zo2)$) normalized by characteristic impedance Zo2 of second transmission line L2. Characteristic impedance Zoa of impedance compensation circuit 12 is changed from the same value as characteristic impedance Zo2 of second transmission line L2 to an open impedance on the real axis of a Smith chart, so that reflection coefficient Γa of the horizontal axis changes from 0.0 to 1.0. The vertical axis indicates a passage loss (dB) caused by reflection coefficient Γa of impedance compensation circuit 12. The passage loss increases in the vertical downward direction.

Γd in FIG. 2 is a reflection coefficient when second transmission line L2 is viewed from node X. The reflection coefficient is a value normalized by characteristic impedance Zo2 of second transmission line L2 and thus is set at 0 at the center frequency of the predetermined frequency band. Thus, Γa=Γd is established if reflection coefficient Γa is 0.0, Γa>Γd is established if reflection coefficient Γa is larger than 0.0, and Γa>>Γd is established if reflection coefficient Γa is close to 1.0.

As is evident from FIG. 2, as reflection coefficient Γa approaches 1.0 from 0.0, the passage loss decreases. Specifically, in a region where Γa>Γd is established and a region where Γa>>Γd is established, the passage loss is smaller than in the case of Γa=Γd.

Thus, as the second characteristic in high-frequency amplifier 10 according to the present embodiment, characteristic impedance Zoa of impedance compensation circuit 12 is set (e.g., Zoa≠Zo2) such that reflection coefficient Γa during viewing of impedance compensation circuit 12 from node X is larger than reflection coefficient Γd during viewing of second transmission line L2 from node X. This suppresses the passage loss caused by reflection coefficient Γa of impedance compensation circuit 12 more than in the establishment of reflection coefficient Γa=reflection coefficient Γd.

Example 1

As a specific example of impedance compensation circuit 12 provided in high-frequency amplifier 10 according to the present embodiment, Example 1 will be described below. In Example 1, impedance compensation circuit 12 is an open stub.

Figure 3:
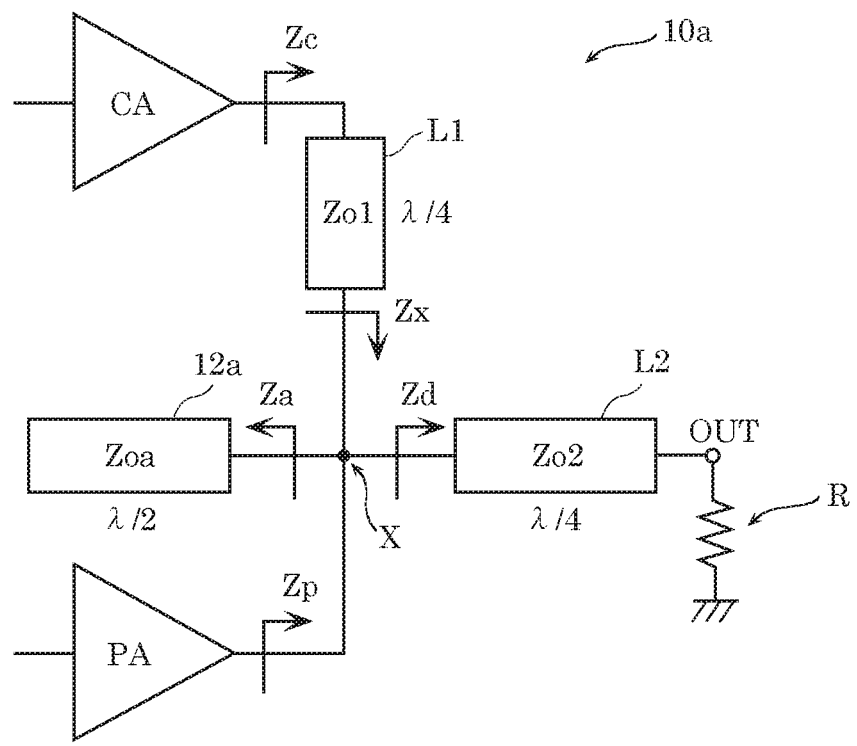
FIG. 3 is an equivalent circuit diagram of a high-frequency amplifier according to Example 1.

FIG. 3 is an equivalent circuit diagram of high-frequency amplifier 10a according to Example 1.

Impedance compensation circuit 12a is an open stub having an electrical length equal to one-half wavelength of a certain frequency (in this case, a center frequency) in a predetermined frequency band. Impedance compensation circuit 12a has one end connected to node X and the other end open. Thus, impedance Za of impedance compensation circuit 12a in the predetermined frequency band becomes an open-circuit impedance in DC at a frequency of 0 Hz. As the frequency increases, a phase rotation occurs in a direction along which the phase decreases (clockwise in a Smith chart). The impedance Za becomes an open-circuit impedance again at the center frequency. In other words, the imaginary part of impedance Za of impedance compensation circuit 12a becomes positive at a frequency lower than the center frequency and becomes negative at a frequency higher than the center frequency.

The imaginary part of impedance Zd during viewing of second transmission line L2 from node X becomes negative at a frequency lower than the center frequency and becomes positive at a frequency higher than the center frequency because second transmission line L2 is a transmission line having an electrical length equal to one-quarter wavelength of the center frequency in the predetermined frequency band.

Thus, when an admittance during viewing of second transmission line L2 from node X is expressed as Yd(=1/Zd) and an admittance during viewing of impedance compensation circuit 12a from node X is expressed as Ya (=1/Za), the imaginary part of admittance Yd and the imaginary part of admittance Ya are opposite in polarity. Consequently, the imaginary part of the denominator (Yd+Ya) on the right sides of equations 1 and 2 has a smaller value than in the absence of impedance compensation circuit 12a (in this case, Yd). In other words, the imaginary part of combined impedance Zx expressed by equation 1 and the imaginary part of load impedance Zp expressed by equation 2 have smaller values, thereby extending the band of high-frequency amplifier 10a.

As described above, impedance compensation circuit 12a of high-frequency amplifier 10a according to Embodiment 1 is an open stub. Impedance compensation circuit 12a has another end that is open, and serves as the open stub having an electrical length equal to one-half wavelength of any frequency in the predetermined frequency band. This can achieve impedance compensation circuit 12a that can extend the band of high-frequency amplifier 10a with simple circuit elements.

The open stub constituting impedance compensation circuit 12a does not need to have an electrical length equal to one-half wavelength of the center frequency in the predetermined frequency band. The open stub may have an electrical length equal to one-half wavelength of any significant frequency in the predetermined frequency band. An electrical length longer than one-half wavelength of the center frequency achieves a wide band at a frequency lower than the center frequency, whereas an electrical length shorter than one-half wavelength of the center frequency achieves a wide band at a frequency higher than the center frequency.

Figure 4:
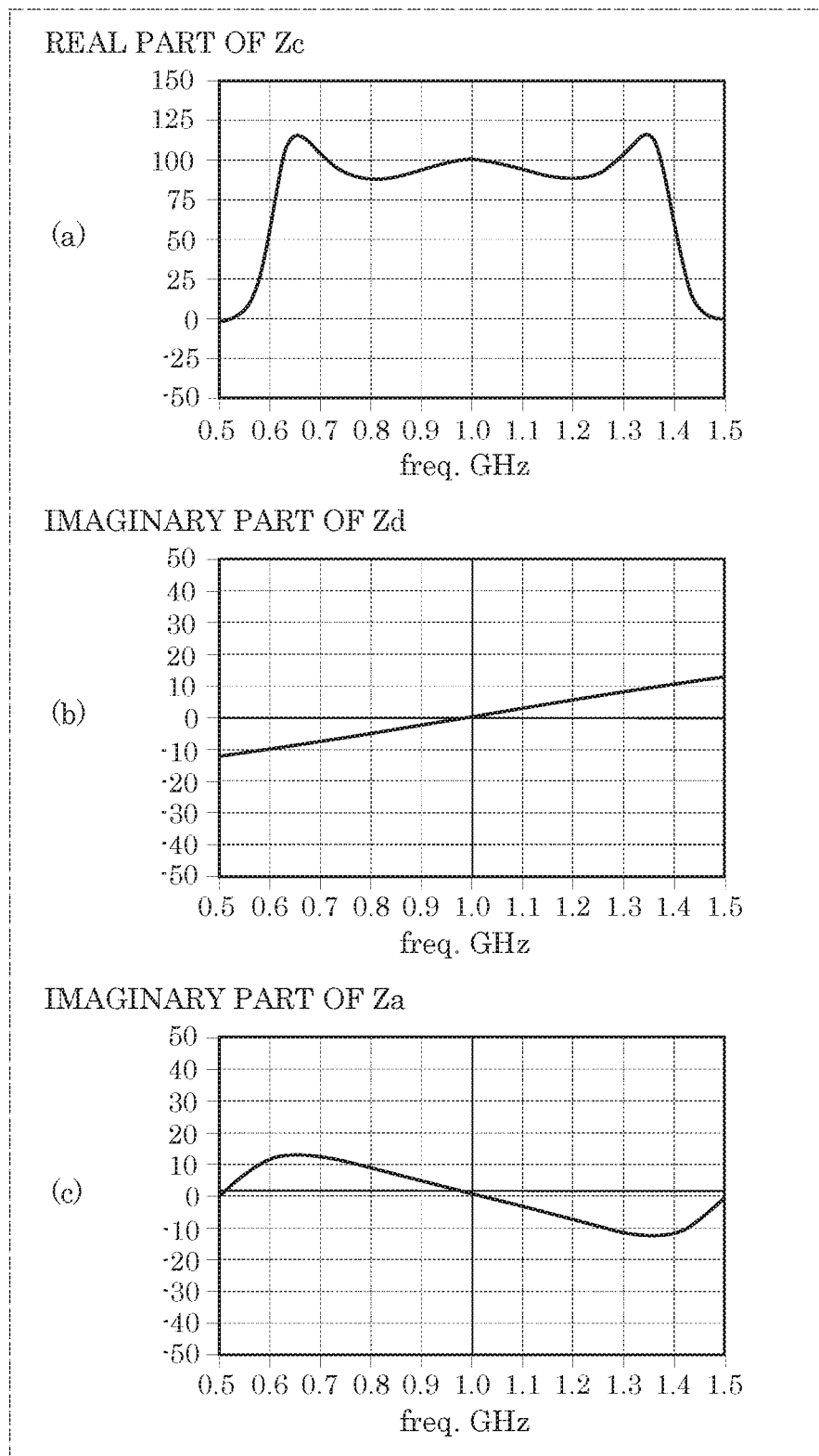
FIG. 4 shows examples of a load impedance or the like of a carrier amplifier in the case where an open stub has an electrical length equal to one-half wavelength of a center frequency in a predetermined frequency band according to Example 1.

FIG. 4 shows examples of load impedance Zc or the like of carrier amplifier CA in the case where the open stub has an electrical length equal to one-half wavelength of the center frequency in the predetermined frequency band according to Example 1. Specifically, FIG. 4 shows examples for the real part of load impedance Zc ((a) in FIG. 4) of carrier amplifier CA when peak amplifier PA is inoperative, the imaginary part of impedance Zd ((b) in FIG. 4) of second transmission line L2, and the imaginary part of impedance Za ((c) in FIG. 4) of impedance compensation circuit 12a in the case where the open stub constituting impedance compensation circuit 12a has an electrical length equal to one-half wavelength of the center frequency (in this case, 1.0 GHz) in the predetermined frequency band. As is understood from (b) and (c) in FIG. 4, the imaginary part of impedance Zd of second transmission line L2 and the imaginary part of impedance Za of impedance compensation circuit 12a are opposite in polarity. Consequently, as is evident from (a) in FIG. 4, the real part of load impedance Zc of carrier amplifier CA is flattened in substantially equal frequency ranges at high frequencies and low frequencies around the center frequency (in this case, 1.0 GHz), thereby extending the band of high-frequency amplifier 10a.

Figure 5:
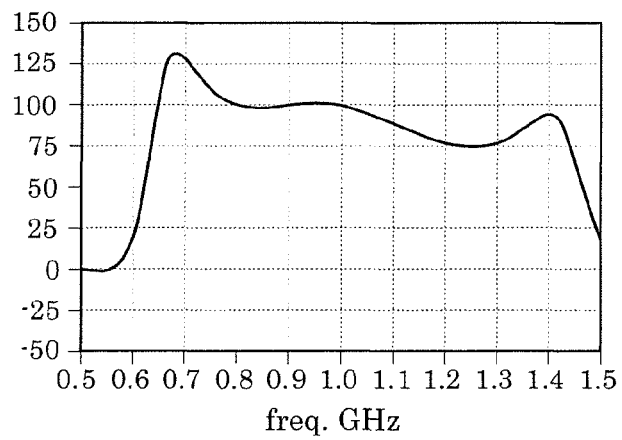
FIG. 5 shows an example of the real part of the load impedance of the carrier amplifier in the case where the electrical length of the open stub according to Example 1 is increased from one-half wavelength of the center frequency in the predetermined frequency band by a phase of 10°.

FIG. 5 shows an example of the real part of load impedance Zc for carrier amplifier CA in the case where the electrical length of the open stub according to Example 1 is increased from one-half wavelength of the center frequency in the predetermined frequency band by a phase of 10°. More specifically, FIG. 5 shows an example of the real part of load impedance Zc for carrier amplifier CA when peak amplifier PA is inoperative in the case where the electrical length of the open stub constituting impedance compensation circuit 12a is increased from one-half wavelength of the center frequency (in this case, 1.0 GHz) in the predetermined frequency band by a phase of 10°. Unlike in (a) of FIG. 4, the real part of load impedance Zc is raised at low frequencies with respect to the center frequency, thereby achieving a wide band.

Figure 6:
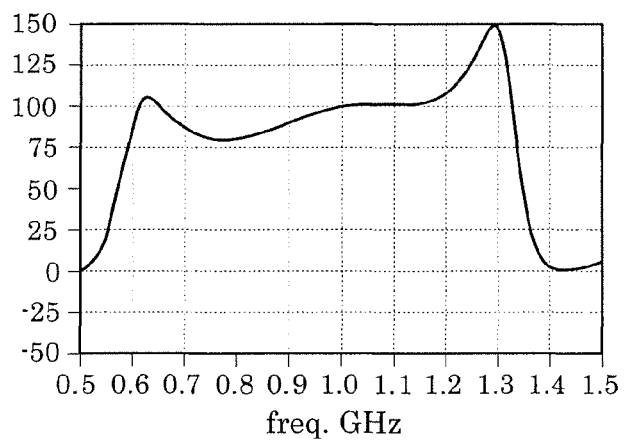
FIG. 6 shows an example of the real part of the load impedance of the carrier amplifier in the case where the electrical length of the open stub according to Example 1 is reduced from one-half wavelength of the center frequency in the predetermined frequency band by a phase of 10°.

FIG. 6 shows an example of the real part of load impedance Zc for carrier amplifier CA in the case where the electrical length of the open stub according to Example 1 is reduced from one-half wavelength of the center frequency in the predetermined frequency band by a phase of 10°. More specifically, FIG. 6 shows an example of the real part of load impedance Zc for carrier amplifier CA when peak amplifier PA is inoperative in the case where the electrical length of the open stub constituting impedance compensation circuit 12a is reduced from one-half wavelength of the center frequency (in this case, 1.0 GHz) in the predetermined frequency band by a phase of 10°. Unlike in (a) of FIG. 4, the real part of load impedance Zc is raised at high frequencies with respect to the center frequency, thereby achieving a wide band.

In view of the impedance characteristics and efficiency characteristics of used devices, a Doherty amplifier may be adjusted so as to perform an asymmetrical operation with an output power ratio of 0.75:1 to 1.75:1 as well as a symmetrical operation with a one-to-one output power ratio between the maximum outputs of peak amplifier PA and carrier amplifier CA. Furthermore, the output impedances of carrier amplifier CA and peak amplifier PA may not be 50Ω. Thus, impedance Zd during viewing of second transmission line L2 from node X does not always have a fixed value in the design of the Doherty amplifier.

For such circumstances, the characteristic impedance Zo2 of second transmission line L2 is adjusted such that impedance Zd during viewing of second transmission line L2 from node X is matched with combined impedance Zx of carrier amplifier CA and peak amplifier PA. At this point, the frequency characteristics of the imaginary part of impedance Zd depend on characteristic impedance Zo2 of second transmission line L2, characteristic impedance Zo2 being obtained by impedance conversion. Thus, the compensation amount of the imaginary part of impedance compensation circuit 12a desirably corresponds to characteristic impedance Zo2 of second transmission line L2.

Figure 7:
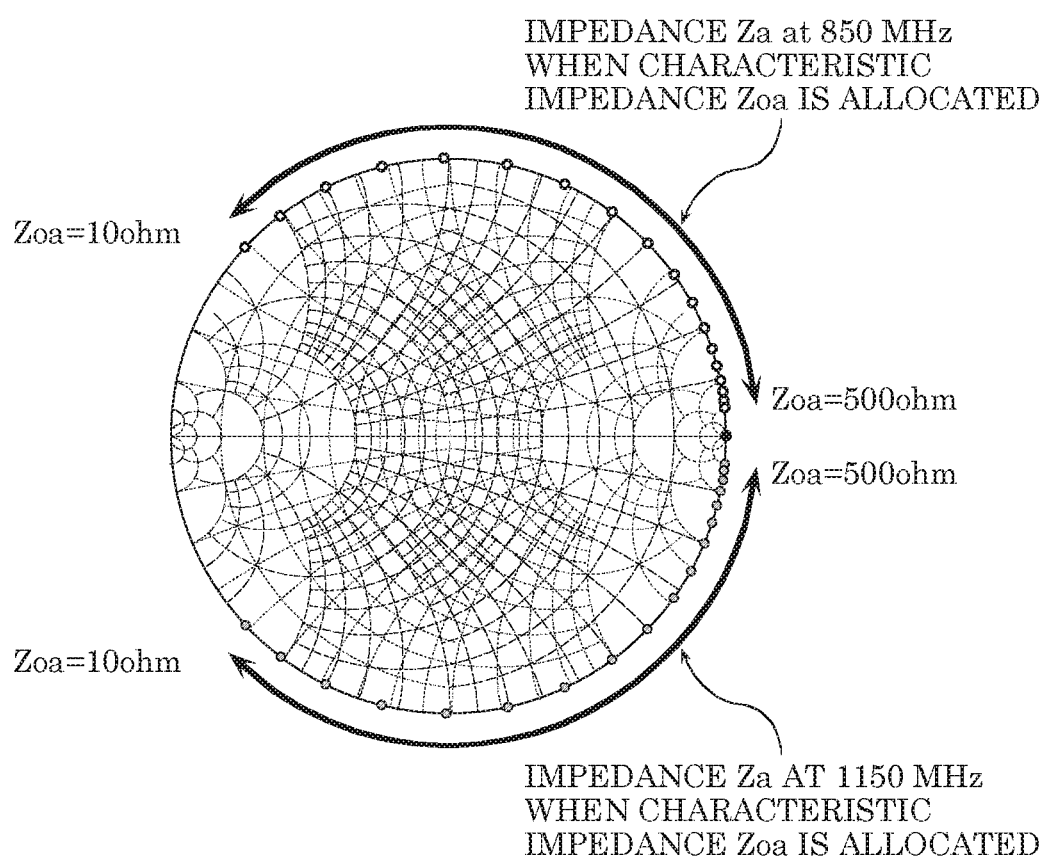
FIG. 7 shows the impedance of the impedance compensation circuit at a specific frequency when the characteristic impedance of an impedance compensation circuit according to Example 1 is allocated as a parameter.

FIG. 7 shows impedance Za of impedance compensation circuit 12a at a specific frequency when characteristic impedance Zoa of impedance compensation circuit 12a according to Example 1 is allocated as a parameter. More specifically, FIG. 7 shows impedance Za of impedance compensation circuit 12a at 850 MHz and 1150 MHz under normalization at 50Ω when characteristic impedance Zoa of impedance compensation circuit 12a is allocated as a parameter. Impedance compensation circuit 12a is an open stub in which a transmission line has one open end with an electrical length equal to one-half wavelength at 1 GHz.

As is evident from FIG. 7, for the imaginary part of impedance Za of impedance compensation circuit 12a, a compensation amount can be adjusted by changing the characteristic impedance Zoa of impedance compensation circuit 12a. An optimum value for characteristic impedance Zoa of impedance compensation circuit 12a can be determined according to the region of the reflection coefficient (more specifically, reflection coefficient Γc when first transmission line L1 is viewed from the output terminal of carrier amplifier CA) of a load permissible as a frequency characteristic of high-frequency amplifier 10a.

A specific method of determining characteristic impedance Zoa of impedance compensation circuit 12a according to the present example will be described below. Impedance compensation circuit 12a is an open stub in the present example.

Figure 8:
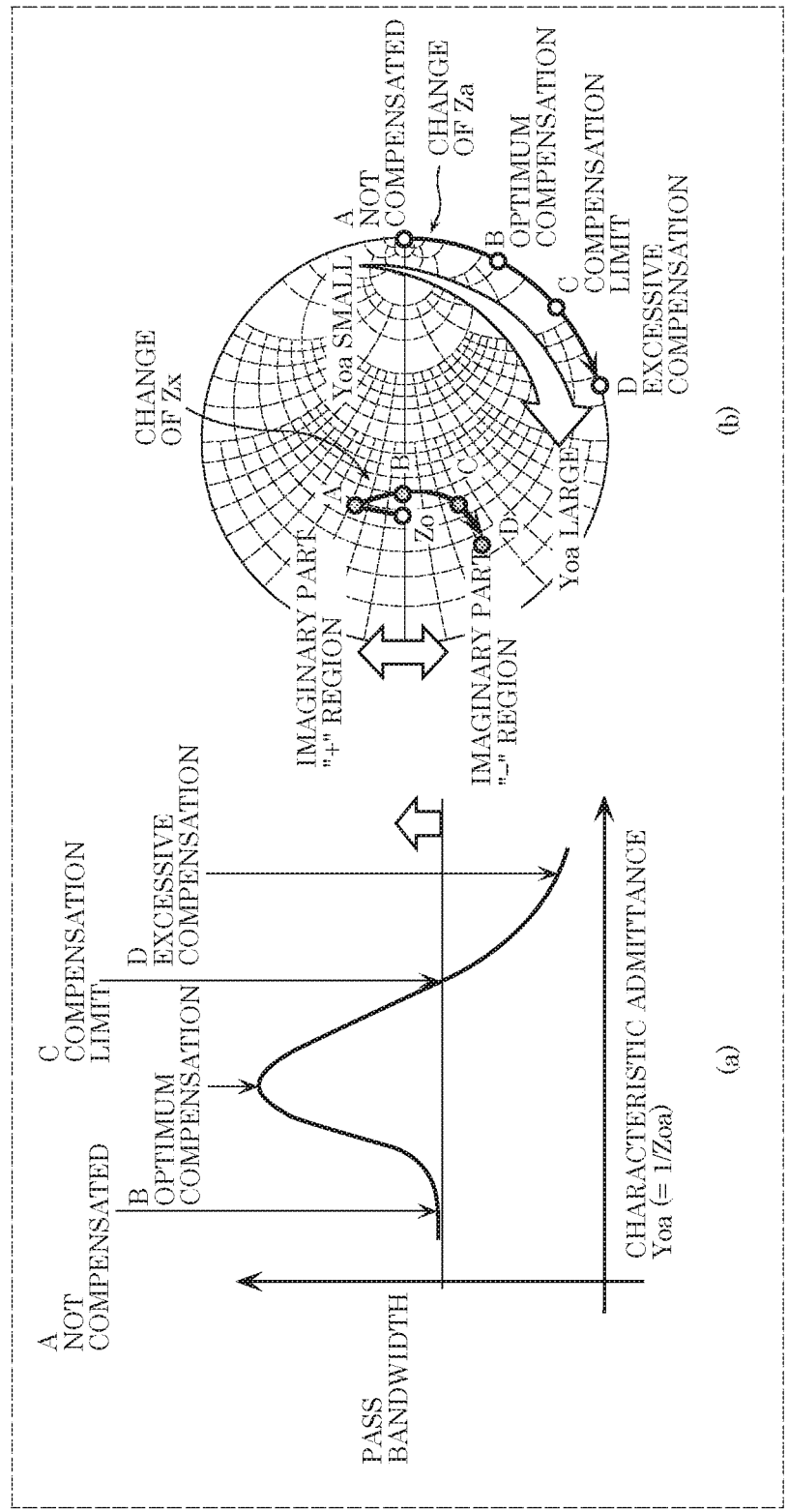
FIG. 8 is an explanatory drawing showing the relationship between a pass bandwidth and the characteristic admittance of the impedance compensation circuit according to Example 1.

FIG. 8 is an explanatory drawing showing the relationship between a pass bandwidth and characteristic admittance Yoa (=1/Zoa) of impedance compensation circuit 12a according to Example 1. More specifically, (a) in FIG. 8 shows the relationship between a pass bandwidth and characteristic admittance Yoa of impedance compensation circuit 12a. The pass bandwidth is a frequency range that allows passage without attenuation below a predetermined value (e.g., a value reduced from the passage characteristic of the center frequency by a specified value) in the passage characteristics of carrier amplifier CA. Moreover, (b) in FIG. 8 shows examples of values of impedance Za for impedance compensation circuit 12a and combined impedance Zx of impedance Za and impedance Zd at points (A: not compensated, B: optimum compensation, C: compensation limit, D: excessive compensation) in (a) of FIG. 8.

Point A (not compensated) of (a) in FIG. 8 indicates the absence of impedance compensation circuit 12a. In this state, combined impedance Zx matches with impedance Zd during viewing of second transmission line L2 from node X. Thus, as shown in (b) in FIG. 8, combined impedance Zx has an imaginary part (in this case, an imaginary part with a positive sign). Therefore, as shown in (a) in FIG. 8, the pass bandwidth has a smaller value (i.e., a narrow band) than a value at point B (optimum compensation).

Point B (optimum compensation) in (b) in FIG. 8 indicates the presence of impedance compensation circuit 12a and the cancellation of the imaginary part of impedance Za during viewing of impedance compensation circuit 12a from node X and the imaginary part of impedance Zd during viewing of second transmission line L2 from node X. In short, impedance compensation circuit 12a has an optimum compensation function. In this state, combined impedance Zx only has a real part as shown in (b) in FIG. 8. Therefore, as shown in (a) in FIG. 8, the pass bandwidth is maximized (that is, a wide band).

Point C (compensation limit) in (b) in FIG. 8 indicates that impedance compensation circuit 12a is provided and the amount of the imaginary part of impedance Za during viewing of impedance compensation circuit 12a from node X is increased by a certain amount from the amount of the imaginary part of impedance Zd during viewing of second transmission line L2 from node X. In short, impedance compensation circuit 12a has reached the limit of the effective compensation function. In this state, combined impedance Zx has an imaginary part (in this case, an imaginary part with a negative sign) as shown in (b) in FIG. 8. Therefore, as shown in (a) in FIG. 8, the pass bandwidth has the same value as point A.

Point D (excessive compensation) in (b) in FIG. 8 indicates that impedance compensation circuit 12a is provided and the amount of the imaginary part of impedance Za during viewing of impedance compensation circuit 12a from node X is quite larger than the amount of the imaginary part of impedance Zd during viewing of second transmission line L2 from node X. In this state, combined impedance Zx has a large imaginary part (in this case, a large imaginary part with a negative sign) as shown in (b) in FIG. 8. Therefore, as shown in (a) in FIG. 8, the pass bandwidth is smaller than the value of point A.

A change from point A to point B, point C, and point D in this order in (a) in FIG. 8 corresponds to an increase in the amount of the imaginary part of impedance Za during viewing of impedance compensation circuit 12a from node X. If impedance compensation circuit 12a includes an open stub, the change corresponds to an increase in characteristic admittance Yoa of impedance compensation circuit 12a (see (b) in FIG. 8). Thus, as indicated by (a) in FIG. 8, the pass bandwidth is sequentially changed from point A to point B, point C, and point D by increasing characteristic admittance Yoa of impedance compensation circuit 12a.

It is therefore understood that characteristic admittance Yoa of impedance compensation circuit 12a has to be set in the range of point A to point C in order to effectively perform the compensation function of impedance compensation circuit 12a and thus characteristic admittance Yoa has to be smaller than a value corresponding to point C.

However, it is necessary to consider that the relationship between the pass bandwidth and characteristic admittance Yoa of impedance compensation circuit 12a in (a) in FIG. 8 depends on reflection coefficient Γc during viewing of first transmission line L1 from the output terminal of carrier amplifier CA.

Figure 9:
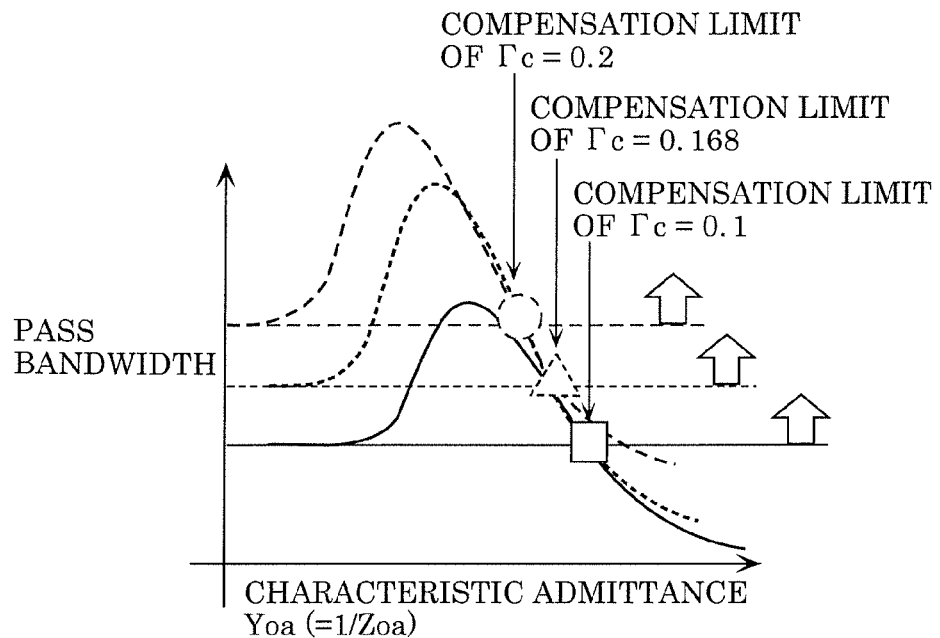
FIG. 9 shows how the relationship between the pass bandwidth and the characteristic admittance of the impedance compensation circuit according to Example 1 changes depending on a reflection coefficient on the output terminal of the carrier amplifier.

FIG. 9 shows how the relationship between the pass bandwidth and characteristic admittance Yoa of impedance compensation circuit 12a according to Example 1 changes depending on reflection coefficient Γc on the output terminal of carrier amplifier CA. FIG. 9 shows three values (0.1, 0.168, 0.2) of reflection coefficient Γc.

As shown in FIG. 9, as reflection coefficient Γc increases (specifically, as the range of permissible reflection coefficient Γc increases), characteristic admittance Yoa of impedance compensation circuit 12a at point C (compensation limit) decreases.

Figure 10:
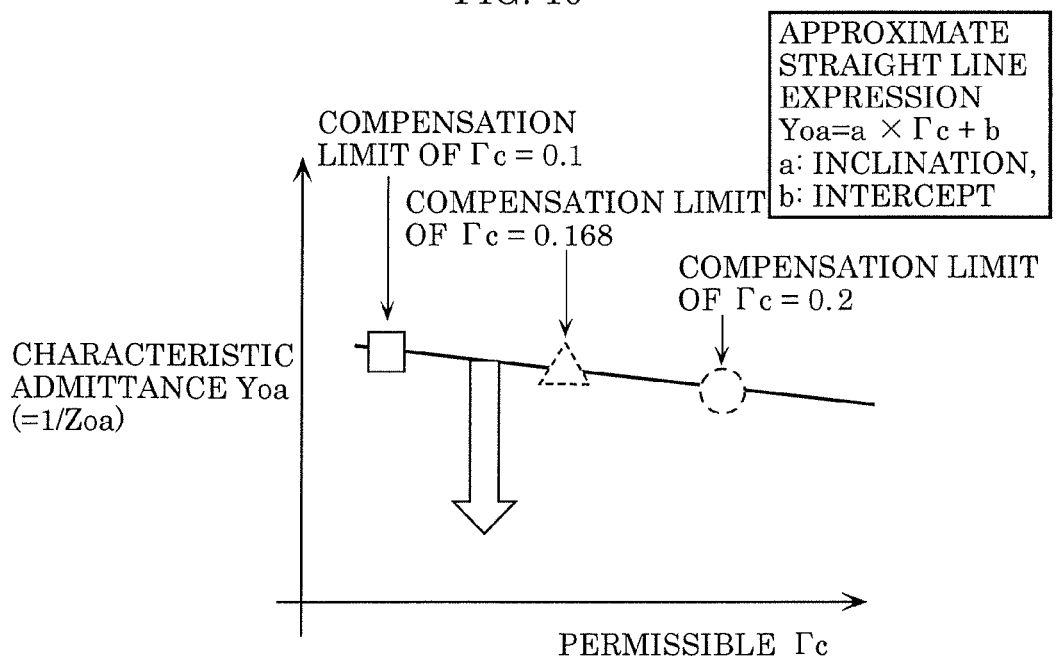
FIG. 10 shows the range of the characteristic admittance necessary for effectively performing a compensation function by the impedance compensation circuit according to Example 1.

FIG. 10 shows the range of characteristic admittance Yoa necessary for effectively performing the compensation function by impedance compensation circuit 12a according to Example 1. In other words, FIG. 10 shows the range of characteristic admittance Yoa of impedance compensation circuit 12a at or below point C (compensation limit) for each reflection coefficient Γc in FIG. 9.

As is evident from FIG. 10, in order to effectively perform the compensation function by impedance compensation circuit 12a, characteristic admittance Yoa of impedance compensation circuit 12a has to be equal to or lower than an approximate straight line (a×Γc+b) where a and b are coefficients.

Figure 11:
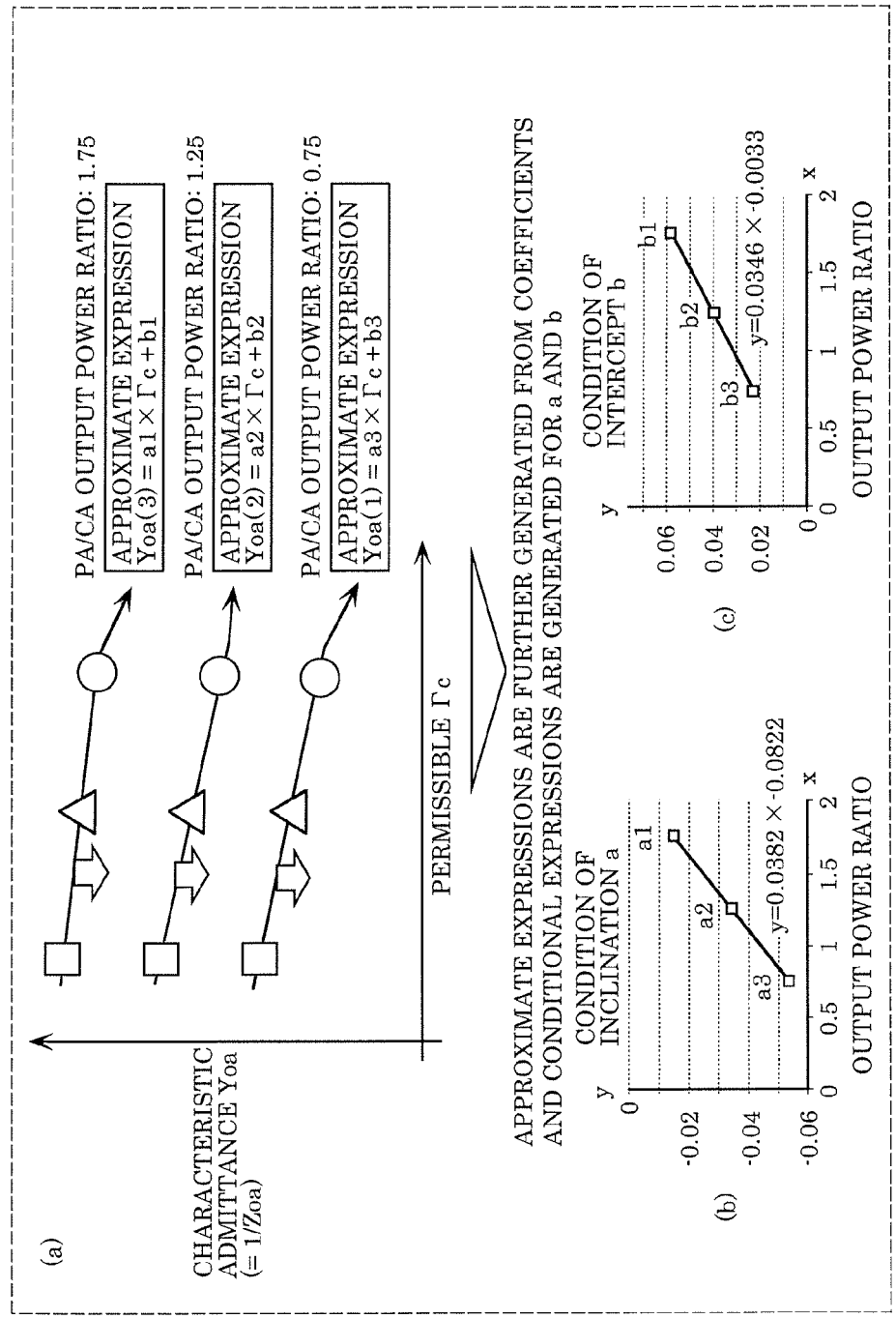
FIG. 11 is an explanatory drawing showing that coefficient a and coefficient b of an approximate straight line in FIG. 10 are determined depending on the output power ratio of PA/CA.

In this case, coefficient a (the inclination of the approximate straight line) and coefficient b (the intercept of the approximate straight line) are values determined depending on the output power ratio of PA/CA where CA is the output power of carrier amplifier CA and PA is the output power of peak amplifier PA at the maximum outputs of carrier amplifier CA and peak amplifier PA. Referring to FIG. 11, the detail will be discussed below.

FIG. 11 is an explanatory drawing showing that coefficient a and coefficient b of the approximate straight line in FIG. 10 are determined depending on the output power ratio of PA/CA. More specifically, (a) in FIG. 11 shows, depending on the output power ratio of PA/CA, a change of the relationship between reflection coefficient Γc and the range of characteristic admittance Yoa necessary for effectively performing the compensation function by impedance compensation circuit 12a. (a) in FIG. 11 shows three values (1.75, 1.25, 0.75) as the output power ratio of PA/CA. Regarding the relationship between reflection coefficient Γc and the upper limit value of characteristic admittance Yoa necessary for effectively performing the compensation function by impedance compensation circuit 12a, as shown in FIG. 11, the approximate straight line is determined from data in FIG. 11 so as to calculate the specific values (a1, a2, a3 and b1, b2, b3) of coefficient a and coefficient b for the three output power ratios of PA/CA.

(b) in FIG. 11 shows the relationship between the specific values (a1, a2, a3) of coefficient a determined on the approximate straight line in (a) in FIG. 11 and the output power ratio of PA/CA. The approximate straight line is determined from data in FIG. 11 so as to calculate the relationship between coefficient a and the output power ratio of PA/CA (coefficient a=0.0382×(output power ratio of PA/CA)−0.0822).

(c) in FIG. 11 shows the relationship between the specific values (b1, b2, b3) of coefficient b determined on the approximate straight line in (a) in FIG. 11 and the output power ratio of PA/CA. The approximate straight line is determined from data in FIG. 11 so as to calculate the relationship between coefficient b and the output power ratio of PA/CA (coefficient b=0.0346×(output power ratio of PA/CA)−0.0033).

As described above, the output power ratio of PA/CA is specified so as to determine coefficient a and coefficient b of the approximate straight line in FIG. 10. The determination of coefficient a and coefficient b defines the expression (a×Γc+b) for calculating, from permissible reflection coefficient Γc, characteristic admittance Yoa for effectively performing the compensation function by impedance compensation circuit 12a.

In other words, in order to allow impedance compensation circuit 12a that is an open stub to efficiently provide the compensation function, the open stub has characteristic admittance Yoa not larger than (a×Γ+b) where Γ is a reflection coefficient during viewing of first transmission line L1 from one of both ends of first transmission line L1 on an opposite side from node X and a and b are coefficients, and a and b are expressed by a primary expression of PA/CA where CA is output power of carrier amplifier CA and PA is output power of peak amplifier PA.

Thus, by specifying permissible reflection coefficient Γc and the output power ratio of PA/CA, characteristic admittance Yoa can be determined for effectively performing the compensation function by impedance compensation circuit 12a including the open stub. Therefore, according to the relationship, impedance compensation circuit 12a including the open stub can securely achieve a wide band unlike in the absence of impedance compensation circuit 12a.

Example 2

As a specific example of impedance compensation circuit 12 provided in high-frequency amplifier 10 according to the present embodiment, Example 2 will be described below. In Example 2, impedance compensation circuit 12 is a short stub.

Figure 12:
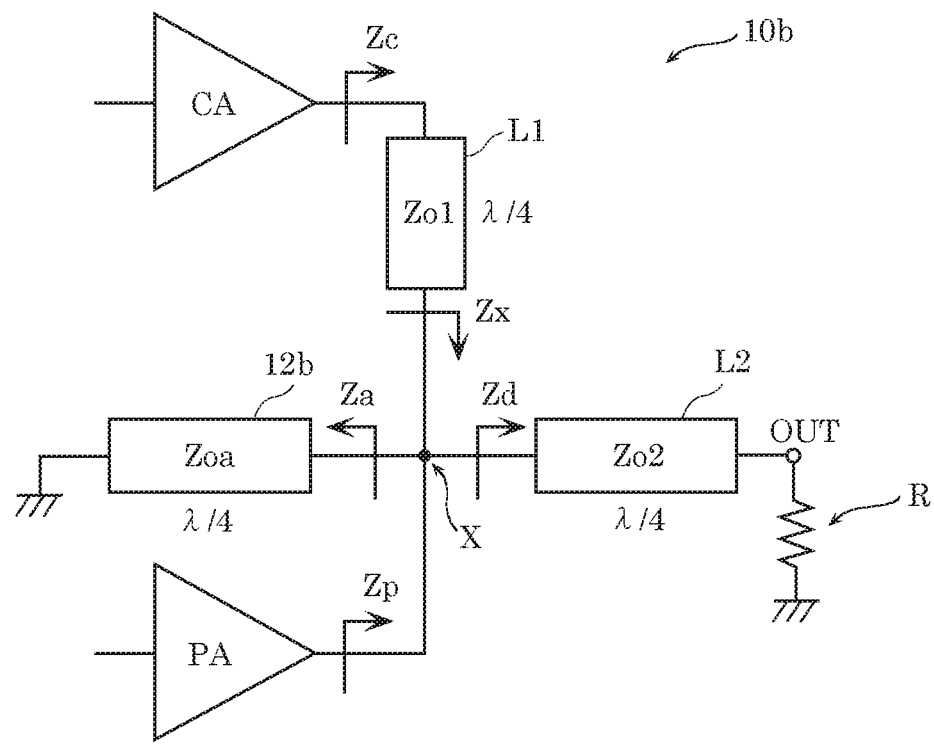
FIG. 12 is an equivalent circuit diagram of a high-frequency amplifier according to Example 2.

FIG. 12 is an equivalent circuit diagram of high-frequency amplifier 10b according to Example 2.

Impedance compensation circuit 12b is a short stub having an electrical length equal to one-quarter wavelength of a certain frequency (in this case, a center frequency) in a predetermined frequency band. Impedance compensation circuit 12b has one end connected to node X and the other grounded end. Thus, impedance Za of impedance compensation circuit 12b in the predetermined frequency band is short-circuited in DC at a frequency of 0 Hz. As the frequency increases, a phase rotation occurs in a direction along which the phase decreases (clockwise in a Smith chart). Impedance Za becomes an open-circuit impedance at the center frequency. In other words, the imaginary part of impedance Za of impedance compensation circuit 12b becomes positive at a frequency lower than the center frequency and becomes negative at a frequency higher than the center frequency.

The imaginary part of impedance Zd during viewing of second transmission line L2 from node X becomes negative at a frequency lower than the center frequency and becomes positive at a frequency higher than the center frequency because second transmission line L2 is a transmission line having an electrical length equal to one-quarter wavelength of the center frequency in the predetermined frequency band.

Thus, when an admittance during viewing of second transmission line L2 from node X is expressed as Yd (=1/Zd) and an admittance during viewing of impedance compensation circuit 12b from node X is expressed as Ya (=1/Za), the imaginary part of admittance Yd and the imaginary part of admittance Ya are opposite in polarity. Consequently, the imaginary part of the denominator (Yd+Ya) on the right sides of equations 1 and 2 has a smaller value than in the absence of impedance compensation circuit 12b (in this case, Yd). In other words, the imaginary part of combined impedance Zx expressed by equation 1 and the imaginary part of load impedance Zp expressed by equation 2 have smaller values, thereby extending the band of high-frequency amplifier 10b.

As described above, impedance compensation circuit 12b of high-frequency amplifier 10b according to Embodiment 2 is a short stub. Impedance compensation circuit 12b has another end that is grounded, and serves as the short stub having an electrical length equal to one-quarter wavelength of any frequency in the predetermined frequency band. This can achieve impedance compensation circuit 12b that can extend the band of high-frequency amplifier 10b with simple circuit elements.

Moreover, a ground capacitor making a high-frequency short circuit is connected to the ground end of the short stub, thereby preventing impedance compensation circuit 12b from passing direct current through the ground. In this case, however, it is necessary to consider the impedance component of the ground capacitor as needed.

Furthermore, the electrical length of the short stub is not limited to one-quarter wavelength as long as the short stub is open at a center frequency in at least one phase rotation. Also in this case, the imaginary part of combined impedance Zx can be reduced as in the case where the electrical length of the short stub is one-quarter wavelength.

The short stub constituting impedance compensation circuit 12b does not need to have an electrical length equal to one-quarter wavelength of the center frequency in the predetermined frequency band. The short stub may have an electrical length equal to one-quarter wavelength of any significant frequency in the predetermined frequency band. An electrical length longer than one-quarter wavelength of the center frequency achieves a wide band at a frequency lower than the center frequency, whereas an electrical length shorter than one-quarter wavelength of the center frequency achieves a wide band at a frequency higher than the center frequency.

Figure 13:
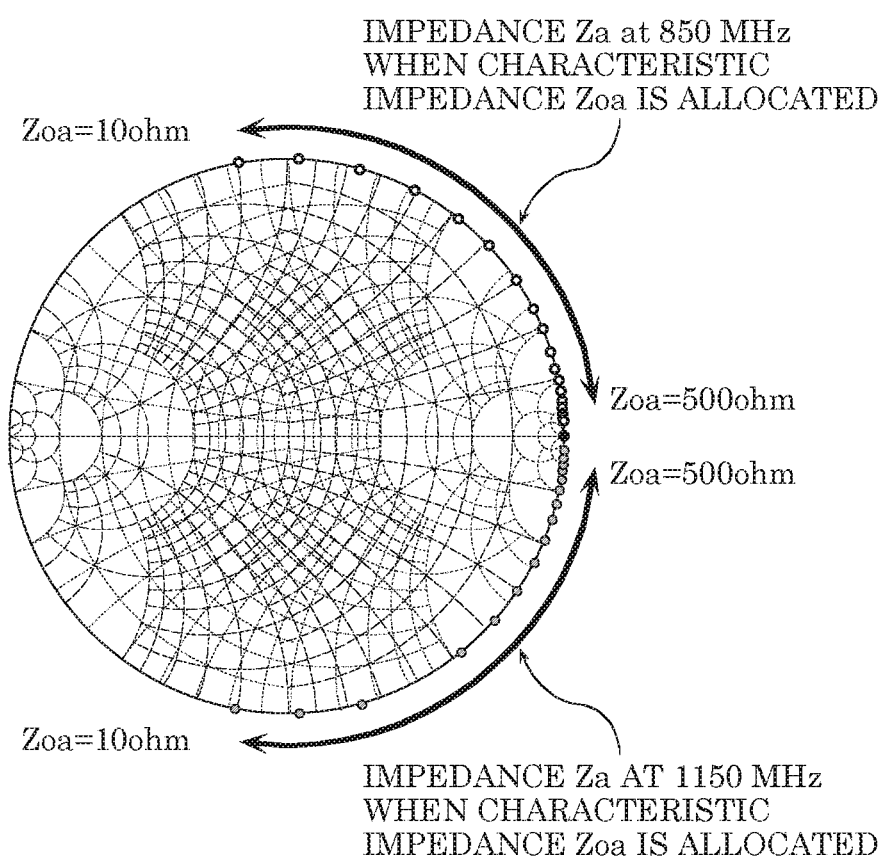
FIG. 13 shows the impedance of an impedance compensation circuit at a specific frequency according to Example 2 when the characteristic impedance of the impedance compensation circuit is allocated as a parameter.

FIG. 13 shows impedance Za of impedance compensation circuit 12b at a specific frequency when characteristic impedance Zoa of impedance compensation circuit 12b according to Example 2 is allocated as a parameter. More specifically, FIG. 13 shows impedance Za of impedance compensation circuit 12b at 850 MHz and 1150 MHz under normalization at 50Ω when characteristic impedance Zoa of impedance compensation circuit 12b is allocated as a parameter. Impedance compensation circuit 12b is a short stub in which a transmission line has one grounded end with an electrical length equal to one-quarter wavelength at 1 GHz.

As shown in FIG. 13, for the imaginary part of impedance Za of impedance compensation circuit 12b, a compensation amount can be adjusted by changing the characteristic impedance Zoa of impedance compensation circuit 12b. An optimum value for characteristic impedance Zoa of impedance compensation circuit 12b can be determined according to the region of the reflection coefficient (more specifically, reflection coefficient Γc when first transmission line L1 is viewed from the output terminal of carrier amplifier CA) of a load permissible as a frequency characteristic of high-frequency amplifier 10b.

Also in the present example in which impedance compensation circuit 12b is a short stub, the specific method of determining characteristic impedance Zoa of impedance compensation circuit 12b is basically identical to that of Example 1.

In other words, in order to allow impedance compensation circuit 12b that is a short stub to efficiently provide the compensation function, the short stub has characteristic admittance Yoa not larger than (a×Γ+b) where Γ is a reflection coefficient during viewing of first transmission line L1 from one of both ends of first transmission line L1 on an opposite side from node X and a and b are coefficients, and a and b are expressed by a primary expression of PA/CA where CA is output power of carrier amplifier CA and PA is output power of peak amplifier PA.

Thus, by specifying permissible reflection coefficient Γc and the output power ratio of PA/CA, characteristic admittance Yoa can be determined for effectively performing the compensation function by impedance compensation circuit 12b including the short stub. Therefore, according to the relationship, impedance compensation circuit 12b including the short stub can securely achieve a wide band unlike in the absence of impedance compensation circuit 12b.

Example 3

As another specific example of impedance compensation circuit 12 provided in high-frequency amplifier 10 according to the present embodiment, Example 3 will be described below. In Example 3, impedance compensation circuit 12 includes a lumped constant circuit.

Figure 14:
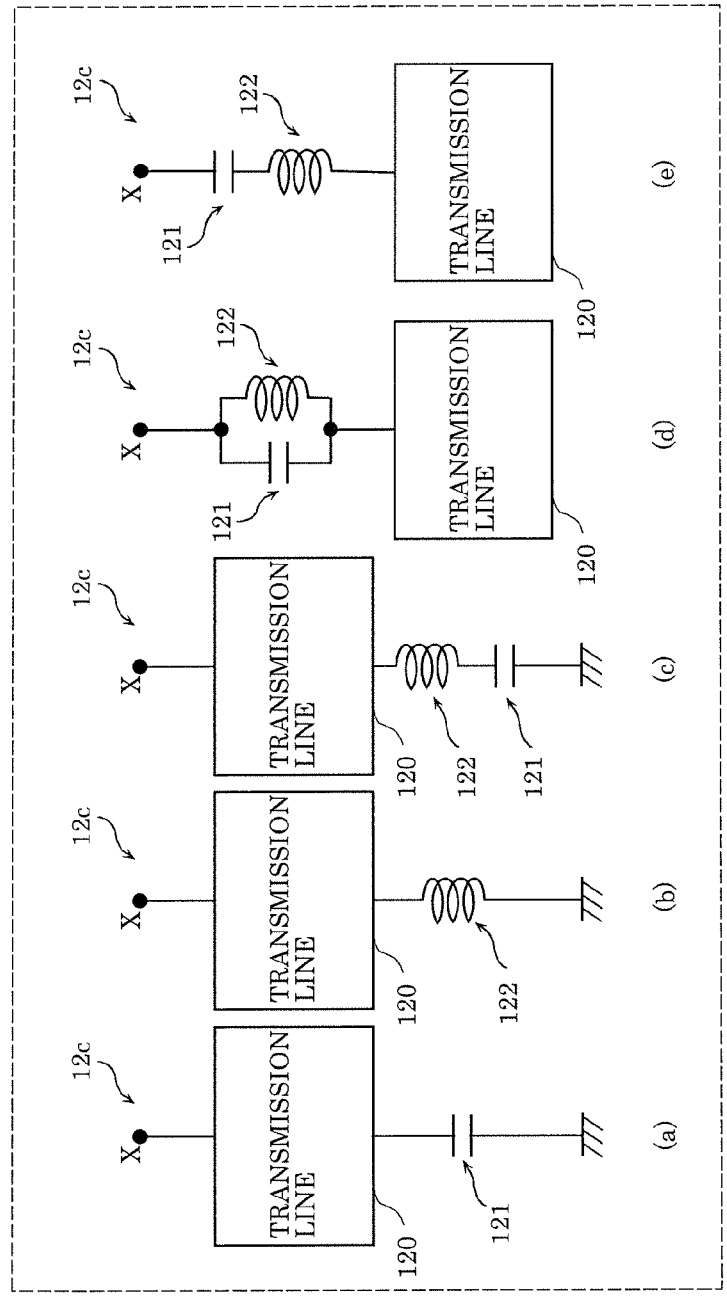
FIG. 14 is a circuit diagram showing configuration examples of a series connection circuit of a distributed constant circuit and a lumped constant circuit from among configuration examples of an impedance compensation circuit according to Example 3.

FIG. 14 is a circuit diagram showing configuration examples of a series connection circuit of a distributed constant circuit (i.e., a transmission line) and a lumped constant circuit from among configuration examples of impedance compensation circuit 12c according to Example 3.

Specifically, impedance compensation circuits 12c in (a) to (c) in FIG. 14 each include a series connection circuit of transmission line 120 acting as a distributed constant circuit and a lumped constant circuit including at least one of capacitor 121 and inductor 122. The other end of impedance compensation circuit 12c is grounded on the opposite side from node X. Impedance compensation circuit 12c can perform substantially the same function as the short stub of Example 2. Impedance compensation circuits 12c in (a) to (c) in FIG. 14 each include a lumped constant circuit and thus can be advantageously reduced in size unlike an impedance compensation circuit only including a transmission line. The connecting positions of the distributed constant circuit and the lumped constant circuit may be replaced with each other.

Impedance compensation circuits 12c in (d) and (e) in FIG. 14 each include a series connection circuit of at least one of capacitor 121 and inductor 122 that are connected to node X and transmission line 120 acting as a distributed constant circuit. The other end of impedance compensation circuit 12c is open on the opposite side from node X. Impedance compensation circuit 12c can substantially perform the same function as the open stub of Example 1. Impedance compensation circuits 12c in (d) and (e) in FIG. 14 each include a lumped constant circuit and thus can be advantageously reduced in size unlike an impedance compensation circuit only including a transmission line.

Figure 15:
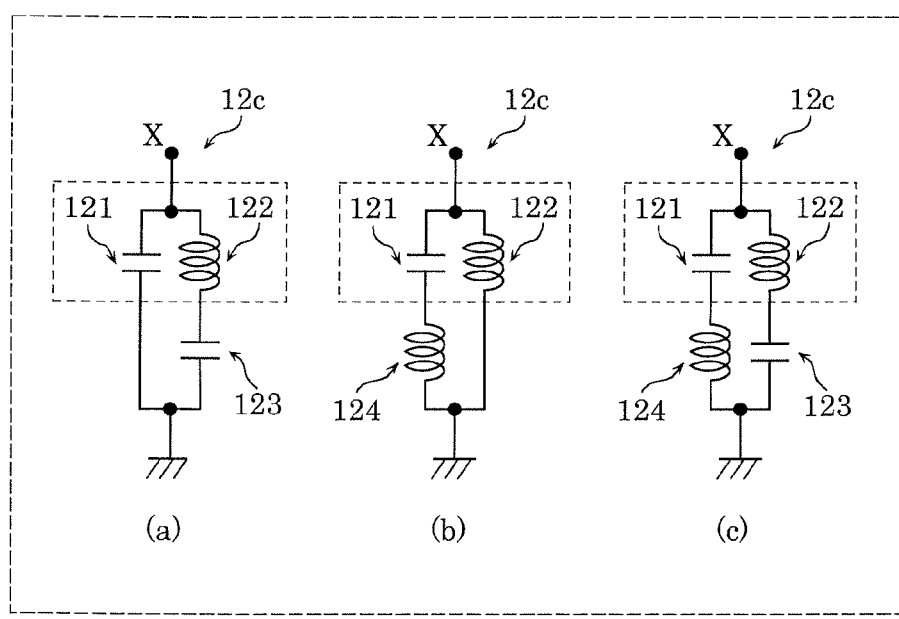
FIG. 15 is a circuit diagram showing configuration examples of a parallel connection circuit from among configuration examples of the impedance compensation circuit according to Example 3.

FIG. 15 is a circuit diagram showing a configuration example of impedance compensation circuit 12c according to Example 3. Impedance compensation circuit 12c includes a parallel connection circuit. The parallel connection circuit includes at least two of an inductor, a capacitor, and a transmission line acting as a distributed constant circuit.

Specifically, impedance compensation circuit 12c in (a) in FIG. 15 includes a parallel connection circuit of capacitor 121 and a series connection circuit of inductor 122 and capacitor 123. Impedance compensation circuit 12c in (b) in FIG. 15 includes a parallel connection circuit of inductor 122 and a series connection circuit of capacitor 121 and inductor 124. Impedance compensation circuit 12c in (c) in FIG. 15 includes a parallel connection circuit of a series connection circuit of capacitor 121 and inductor 124 and a series connection circuit of inductor 122 and capacitor 123. In FIG. 15, circuits surrounded by broken lines may be replaced with transmission lines acting as distributed constant circuits.

In (a) to (c) in FIG. 15, the other end of impedance compensation circuit 12c is grounded on the opposite side from node X. Impedance compensation circuit 12c can substantially perform the same function as the short stub of Example 2. Impedance compensation circuits 12c in (a) to (c) in FIG. 15 each include a lumped constant circuit and thus can be advantageously reduced in size unlike an impedance compensation circuit only including a transmission line.

Example 4

As a specific example of high-frequency amplifier 10 according to the present embodiment, Example 4 will be described below. In Example 4, high-frequency amplifier 10c includes a bias supply circuit.

Figure 16:
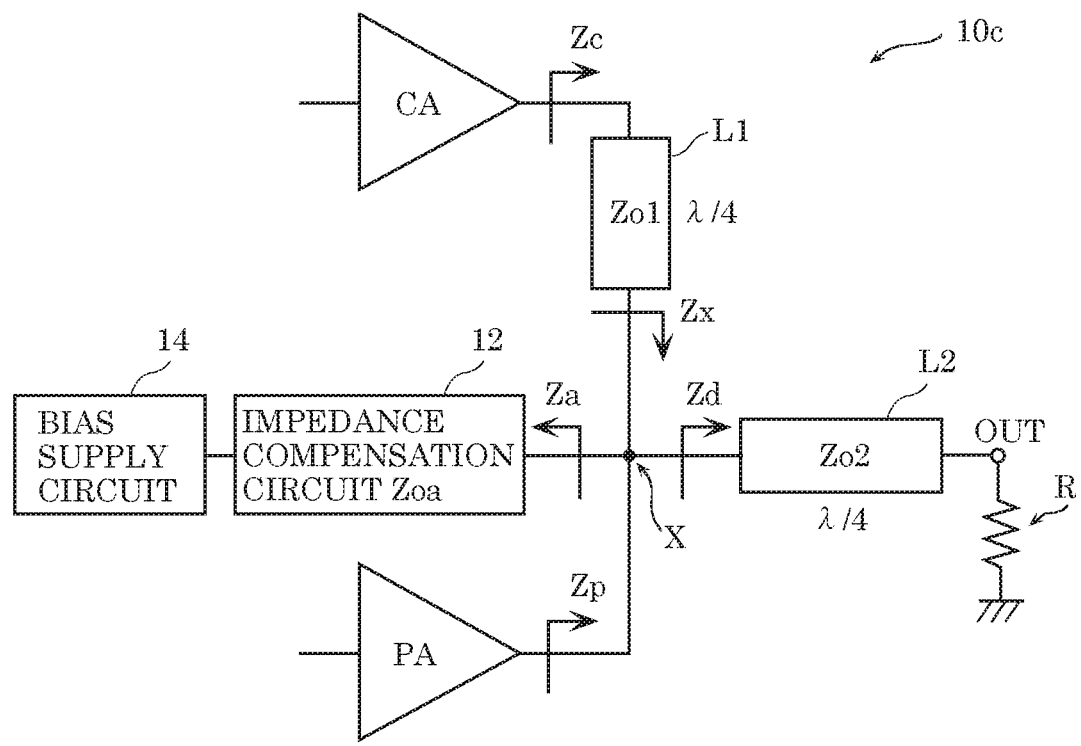
FIG. 16 is an equivalent circuit diagram of a high-frequency amplifier according to Example 4.

FIG. 16 is an equivalent circuit diagram of high-frequency amplifier 10c according to Example 4. Bias supply circuit 14 connected to impedance compensation circuit 12 is added to high-frequency amplifier 10 according to the present embodiment shown in FIG. 1.

Bias supply circuit 14 is a power supply that supplies a bias voltage to carrier amplifier CA and peak amplifier PA through impedance compensation circuit 12. Bias supply circuit 14 is connected to impedance compensation circuit 12 so as to apply a bias voltage to impedance compensation circuit 12. Therefore, impedance compensation circuit 12 also acts as a power supply that supplies a bias voltage. This eliminates the need for a bias line for carrier amplifier CA and a bias line for peak amplifier PA, thereby reducing the size of overall high-frequency amplifier 10c.

Figure 17:
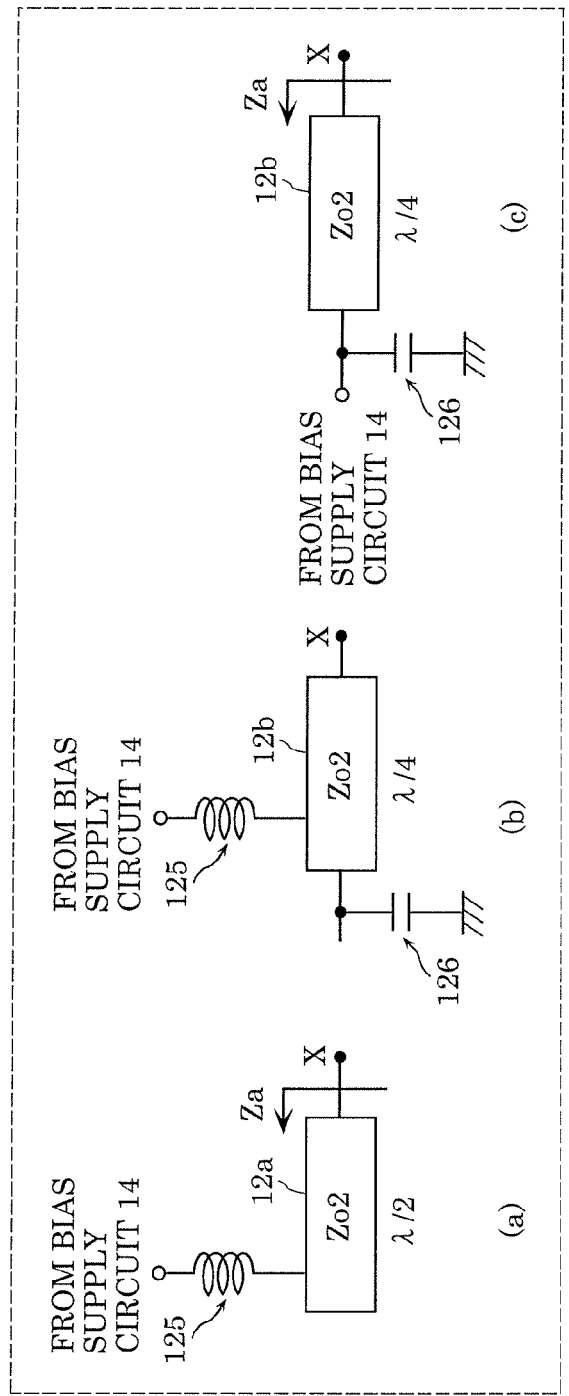
FIG. 17 shows examples of the configuration of bias voltage supply from a bias supply circuit to an impedance compensation circuit according to Example 4.

FIG. 17 shows examples of the configuration of bias voltage supply from bias supply circuit 14 to impedance compensation circuit 12 according to Example 4.

(a) and (b) in FIG. 17 show configurations for supplying a bias voltage from bias supply circuit 14 to impedance compensation circuit 12 through inductor 125. In (a) in FIG. 17, the other end of impedance compensation circuit 12 (a terminal opposite from node X) is open. In (b) in FIG. 17, the other end of impedance compensation circuit 12 (a terminal opposite from node X) is grounded via capacitor 126. Inductor 125 is short-circuited in DC and is open at high frequencies, thereby avoiding high-frequency influence on impedance compensation circuit 12. Thus, the configurations for supplying a bias voltage to impedance compensation circuit 12 via inductor 125 by bias supply circuit 14 are applicable regardless of whether impedance compensation circuit 12 is an open stub or a short stub.

(c) in FIG. 17 shows a configuration for directly supplying a bias voltage to impedance compensation circuit 12 by bias supply circuit 14. In (c) in FIG. 17, the other end of impedance compensation circuit 12 (a terminal opposite from node X) is grounded via capacitor 126. Capacitor 126 connected to the other end of impedance compensation circuit 12 is open in DC, thereby avoiding influence on bias supply circuit 14. Thus, the configuration for directly supplying a bias voltage to impedance compensation circuit 12 by bias supply circuit 14 is applicable if impedance compensation circuit 12 is a short stub.

The high-frequency amplifier according to one example of the present disclosure was described according to the embodiment and Examples 1 to 4. The present disclosure is not limited to the embodiment and Examples 1 to 4. Without departing from the scope of the present disclosure, various modifications may be made for the present embodiment and Examples 1 to 4 by a person skilled in the art or some of the constituent elements of the embodiment and Examples 1 to 4 may be combined as another embodiment within the scope of the present disclosure.

The high-frequency amplifier according to the embodiment and Examples 1 to 4 is a Doherty amplifier. The high-frequency amplifier may be, for example, a so-called inverted Doherty amplifier.

Figure 18:
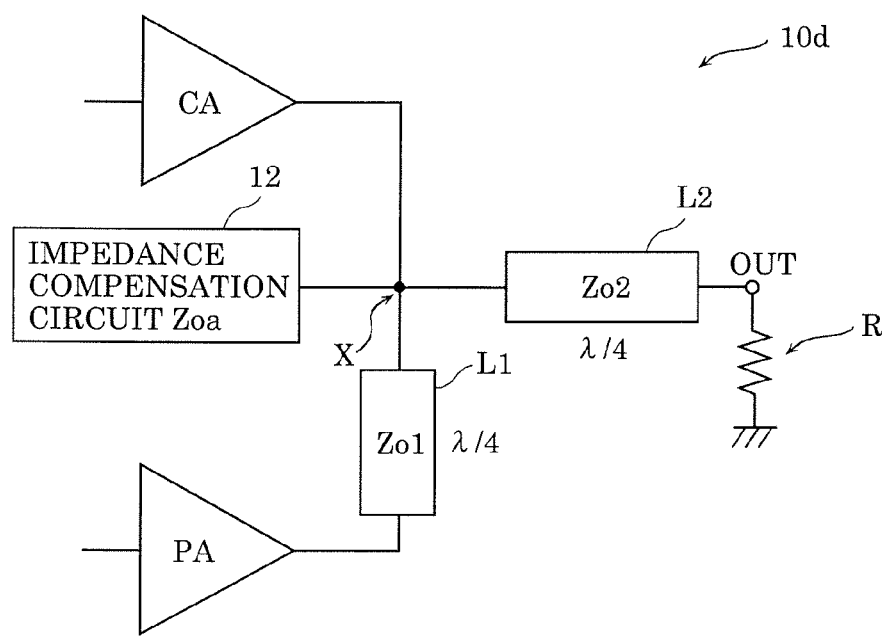
FIG. 18 is an equivalent circuit diagram of a high-frequency amplifier that is applied to a so-called inverted Doherty amplifier.

FIG. 18 is an equivalent circuit diagram of high-frequency amplifier 10d that is applied to a so-called inverted Doherty amplifier. In high-frequency amplifier 10d, node X between first transmission line L1 and second transmission line L2 is connected to the output terminal of carrier amplifier CA instead of the output terminal of peak amplifier PA. Even if high-frequency amplifier 10d is a so-called inverted Doherty amplifier, impedance compensation circuit 12 has the same characteristics as in the case where high-frequency amplifier 10d is a Doherty amplifier. In other words, impedance compensation circuit 12 having the first characteristic can extend the band of high-frequency amplifier 10d. Moreover, impedance compensation circuit 12 having the second characteristic can suppress a passage loss caused by impedance compensation circuit 12 in high-frequency amplifier 10d as compared with the case where reflection coefficient Γa=reflection coefficient Γd is established. Examples 1 to 4 are also applicable to an inverted Doherty amplifier.

In the embodiment, impedance compensation circuit 12 has the first and second characteristics. The second characteristic is not always necessary. This is because impedance compensation circuit 12 having the first characteristic can extend the band of high-frequency amplifier 10.

In impedance compensation circuit 12c according to Example 3, the capacitor and the inductor are used as the lumped constant circuit. A resistance element may be also included. This is because a resistance element can be effectively used for, for example, the attenuation of output power.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure acting as a high-frequency amplifier, particularly, a wide-band high-frequency power amplifier can be used as, for example, a wide-band Doherty amplifier and a wide-band inverted Doherty amplifier that are used for radio communications.

What is claimed is:

1. A high-frequency amplifier that amplifies a first signal and a second signal of a predetermined frequency band and outputs a signal from an output terminal, the high-frequency amplifier comprising:
   a carrier amplifier that amplifies the first signal;
   a peak amplifier that amplifies the second signal;
   a first transmission line connected between an output terminal of the carrier amplifier and an output terminal of the peak amplifier, the first transmission line having an electrical length equal to one-quarter wavelength of a center frequency in the predetermined frequency band;
   a second transmission line connected between one end of the first transmission line and the output terminal of the high-frequency amplifier, the second transmission line having an electrical length equal to one-quarter wavelength of the center frequency; and
   an impedance compensation circuit that has one end connected to a node between the first transmission line and the second transmission line,
   wherein at a frequency lower than the center frequency and at a frequency higher than the center frequency, an imaginary part of an impedance during viewing of the impedance compensation circuit from the node is opposite in polarity from an imaginary part of an impedance during viewing of the second transmission line from the node, and
   a reflection coefficient during viewing of the impedance compensation circuit from the node is larger than a reflection coefficient during viewing of the second transmission line from the node.

2. A high-frequency amplifier that amplifies a first signal and a second signal of a predetermined frequency band and outputs a signal from an output terminal, the high-frequency amplifier comprising:
   a carrier amplifier that amplifies the first signal;
   a peak amplifier that amplifies the second signal;
   a first transmission line connected between an output terminal of the carrier amplifier and an output terminal of the peak amplifier, the first transmission line having an electrical length equal to one-quarter wavelength of a center frequency in the predetermined frequency band;
   a second transmission line connected between one end of the first transmission line and the output terminal of the high-frequency amplifier, the second transmission line having an electrical length equal to one-quarter wavelength of the center frequency; and an impedance compensation circuit that has one end connected to a node between the first transmission line and the second transmission line, wherein at a frequency lower than the center frequency and at a frequency higher than the center frequency, an imaginary part of an impedance during viewing of the impedance compensation circuit from the node is opposite in polarity from an imaginary part of an impedance during viewing of the second transmission line from the node, the impedance compensation circuit is an open stub having an electrical length equal to one-half wavelength of any frequency in the predetermined frequency band, the impedance compensation circuit having another end that is open, and the open stub has a characteristic admittance not larger than (a×Γ+b) where Γ is a reflection coefficient during viewing of the first transmission line from one of both ends of the first transmission line on an opposite side from the node and a and b are coefficients, and a and b are expressed by a primary expression of PA/CA where CA is output power of the carrier amplifier and PA is output power of the peak amplifier.

3. A high-frequency amplifier that amplifies a first signal and a second signal of a predetermined frequency band and outputs a signal from an output terminal, the high-frequency amplifier comprising:

a carrier amplifier that amplifies the first signal;

a peak amplifier that amplifies the second signal;

a first transmission line connected between an output terminal of the carrier amplifier and an output terminal of the peak amplifier, the first transmission line having an electrical length equal to one-quarter wavelength of a center frequency in the predetermined frequency band;

a second transmission line connected between one end of the first transmission line and the output terminal of the high-frequency amplifier, the second transmission line having an electrical length equal to one-quarter wavelength of the center frequency; and an impedance compensation circuit that has one end connected to a node between the first transmission line and the second transmission line, wherein at a frequency lower than the center frequency and at a frequency higher than the center frequency, an imaginary part of an impedance during viewing of the impedance compensation circuit from the node is opposite in polarity from an imaginary part of an impedance during viewing of the second transmission line from the node, and wherein the impedance compensation circuit is a short stub having an electrical length equal to one-quarter wavelength of any frequency in the predetermined frequency band, the impedance compensation circuit having another end that is grounded, and the short stub has a characteristic admittance not larger than (a×Γ+b) where Γ is a reflection coefficient during viewing of the first transmission line from one of both ends of the first transmission line on an opposite side from the node and a and b are coefficients, and a and b are expressed by a primary expression of PA/CA where CA is output power of the carrier amplifier and PA is output power of the peak amplifier.

4. The high-frequency amplifier according to claim 1, wherein the impedance compensation circuit includes a series connection circuit, the series connection circuit including a transmission line and at least one of a capacitor and an inductor, the transmission line acting as a distributed constant circuit.

5. The high-frequency amplifier according to claim 4, wherein the series connection circuit includes a transmission line connected to another end of the impedance compensation circuit, and the other end of the impedance compensation circuit is open.

6. The high-frequency amplifier according to claim 1, wherein the impedance compensation circuit includes a parallel connection circuit, the parallel connection circuit including at least two of an inductor, a capacitor, and a transmission line, the transmission line acting as a distributed constant circuit.

7. The high-frequency amplifier according to claim 1, further comprising a bias supply circuit that applies a bias voltage to the impedance compensation circuit.

8. The high-frequency amplifier according to claim 7, wherein another end of the impedance compensation circuit is open, and the bias supply circuit includes an inductor and applies the bias voltage to the impedance compensation circuit through the inductor.

9. The high-frequency amplifier according to claim 7, wherein the impedance compensation circuit has another end connected to a capacitor that grounds the other end, and the bias supply circuit includes an inductor and applies the bias voltage to the impedance compensation circuit through the inductor.

10. The high-frequency amplifier according to claim 7, wherein the impedance compensation circuit has another end connected to a capacitor that grounds the other end, and the bias supply circuit applies the bias voltage to the other end of the impedance compensation circuit.

\* \* \* \* \*